United States Patent [19]
DeBoer et al.

[11] Patent Number: 5,804,999
[45] Date of Patent: Sep. 8, 1998

[54] APPLIANCE AC POWER CONTROL APPARATUS

[75] Inventors: David P. DeBoer, Cedarburg; August A. Divjak, Waukesha, both of Wis.

[73] Assignee: Johnson Controls, Inc., Milwaukee, Wis.

[21] Appl. No.: 512,814

[22] Filed: Aug. 9, 1995

[51] Int. Cl.$^6$ ................................................ H03K 19/082
[52] U.S. Cl. ...................... 327/110; 327/126; 327/131; 327/137; 327/139; 327/365; 327/561
[58] Field of Search .................................... 327/110, 131, 327/137, 139, 126, 365, 561

[56] References Cited

U.S. PATENT DOCUMENTS 4,044,296  8/1977  Dhyanchand et al. ..................... 322/25
4,238,723  12/1980  Jenks ......................................... 323/24

Primary Examiner—Margaret Rose Wambach
Attorney, Agent, or Firm—Harness, Dickey & Pierce, P.L.C.

[57] ABSTRACT

An apparatus for controlling an electrical appliance coupled with an output terminus and configured to operate in response to an alternating input signal, such as input AC power. The apparatus comprises a reference signal generator for receiving the input signal and generating a reference signal (either $V_{RAMP}$ or $V_{CONTROL}$) in response to the input signal, and a control circuit for controlling connection of the input signal to the output terminus in response to the reference signal and to a user-defined set-point signal. The control circuit is coupled with the reference signal generator and with a set-point terminal. The set-point terminal receives the set-point signal and the control circuit controls connection of the input signal with the output terminus in response to a predetermined relationship between the reference signal and the set-point signal; the apparatus is capable of generating a modified periodically interrupted AC power output based on an AC power input. In a preferred embodiment, the modified AC power output is asymmetrically periodic.

23 Claims, 6 Drawing Sheets

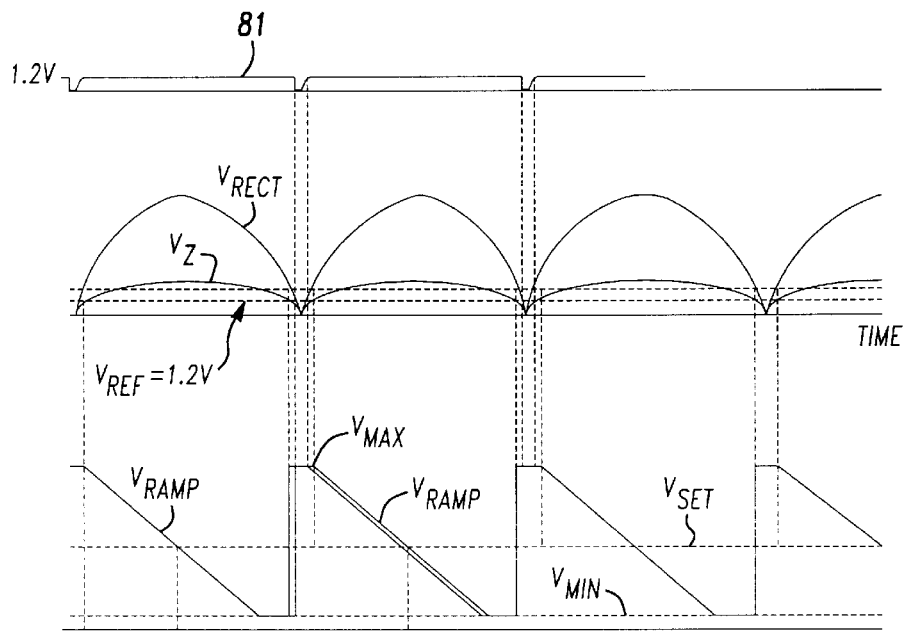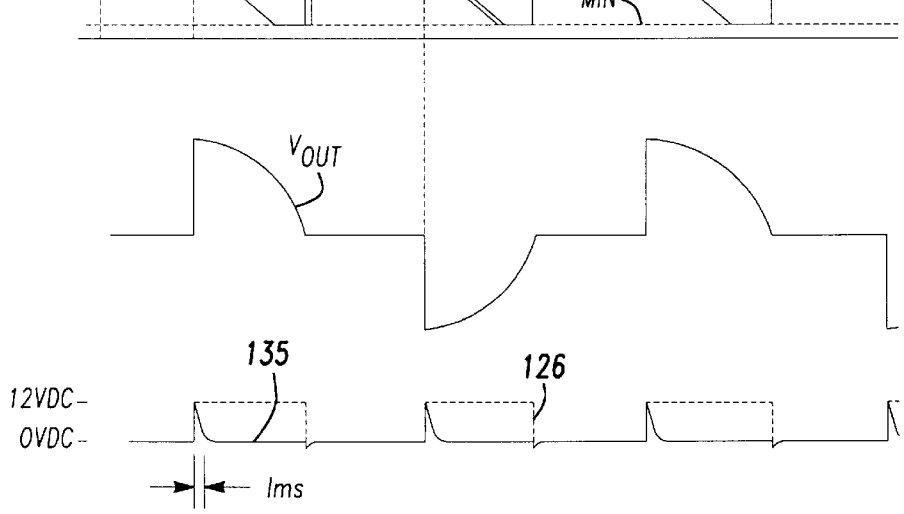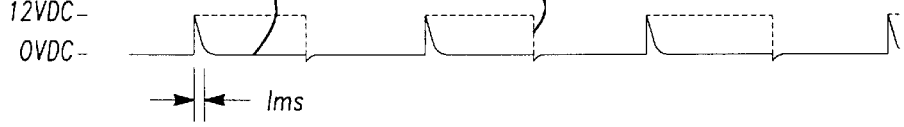

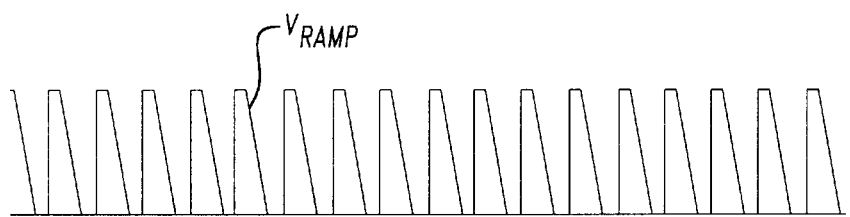
Fig-8a
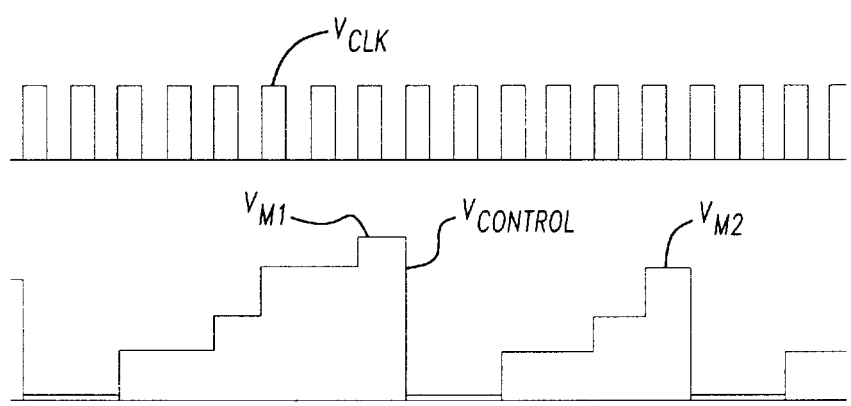
Fig-8b
Fig-8c
Fig-8d
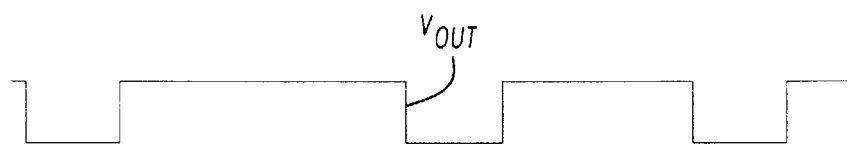
Fig-8e
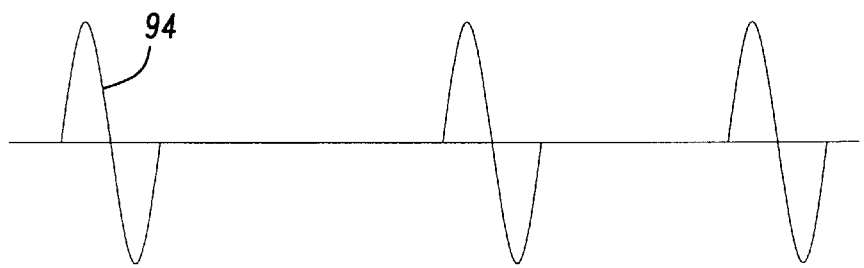
Fig-8f

5,804,999

APPLIANCE AC POWER CONTROL APPARATUS

TECHNICAL FIELD OF THE INVENTION

The present application relates to apparatus for controlling an electrical appliance, particularly an electrical appliance configured to operate in response to an alternating input signal. A particular embodiment of the invention is an apparatus for controlling an AC (alternating current) motor.

BACKGROUND OF THE INVENTION

In the motor control embodiment of the present invention, a four-speed control is disclosed which operates significantly more quietly than prior art controls.

Further, a particular embodiment of a ramp generator section of the present invention is disclosed which provides a ramp generator of simpler design than prior art ramp generators. The ramp generator of the present invention requires a lower part count than prior art ramp generators, is of less expensive construction than prior art ramp generators, and provides reliable operation.

There is a need for appliance controls which are low in cost yet reliable in their operation.

SUMMARY OF THE INVENTION

The present invention is an apparatus for controlling an electrical appliance. The appliance is coupled with an apparatus output terminus and is configured to operate in response to an alternating input signal. The apparatus comprises a reference signal generator for receiving the input signal and generating a reference signal in response to the input signal, and a control circuit for controlling connection of the input signal to the output terminus in response to the reference signal and to a user-defined set-point signal. The control circuit is coupled with the reference signal generator and with a set-point terminal. The set-point terminal receives the set-point signal and the control circuit controls connection of the input signal with the input terminus in response to a predetermined relationship between the reference signal and the set-point signal.

Preferably, the control circuit includes a comparator for comparing the reference signal with the set-point signal. The comparator is coupled with the reference signal generator and with the set-point terminal and generates an output, or control, signal when the reference signal and the set-point signal are in a predetermined relation. The output signal effects interrupting or other control of the connection of the input signal with the output terminus.

In its most preferred embodiment, the control circuit includes an isolating unit for electrically isolating the comparator from the apparatus output terminus. The isolating unit is most preferably an optically coupled isolator.

In one embodiment of the present invention, the appliance control is an electrical motor, and the apparatus further includes a counter for counting time intervals and a digital-to-analog converter for converting digital signals to analog signals. In this motor control embodiment, the ramp signal generator is coupled to the comparator through a counter and a digital-to-analog converter. The counter is coupled with the ramp signal generator and receives the ramp reference signal from the ramp signal generator. The digital-to-analog converter is coupled with the counter to receive the clock signal from the counter. The digital-to-analog converter generates a stepped asymmetrically periodized reference signal in response to the clock signal. The comparator receives the asymmetrically periodized reference signal and compares that signal with the set-point signal to generate the control signal when the asymmetrically periodized reference signal and the set-point signal are in the predetermined relationship.

Therefore, it is an object of the present invention to provide an apparatus for controlling an electrical appliance which is inexpensive to manufacture.

It is a further object of the present invention to provide an apparatus for controlling an electrical appliance which is reliable in its operation.

It is yet a further object of the present invention to provide an apparatus for controlling an electrical appliance which is quiet in its operation when the electrical appliance controlled is an electrical motor.

Further advantages, objects, and features of the present invention will be apparent from the following specification and claims when considered in connection with the accompanying drawings.

BRIEF DESCRIPTION OF THE DRAWINGS

FIGS. 3a–3d are timing diagrams of selected waveforms associated with the present invention.

FIGS. 8a–8f are timing diagrams of various waveforms associated with the motor control embodiment of the present invention.

DETAILED DESCRIPTION OF ILLUSTRATED EMBODIMENTS

Figure 1:
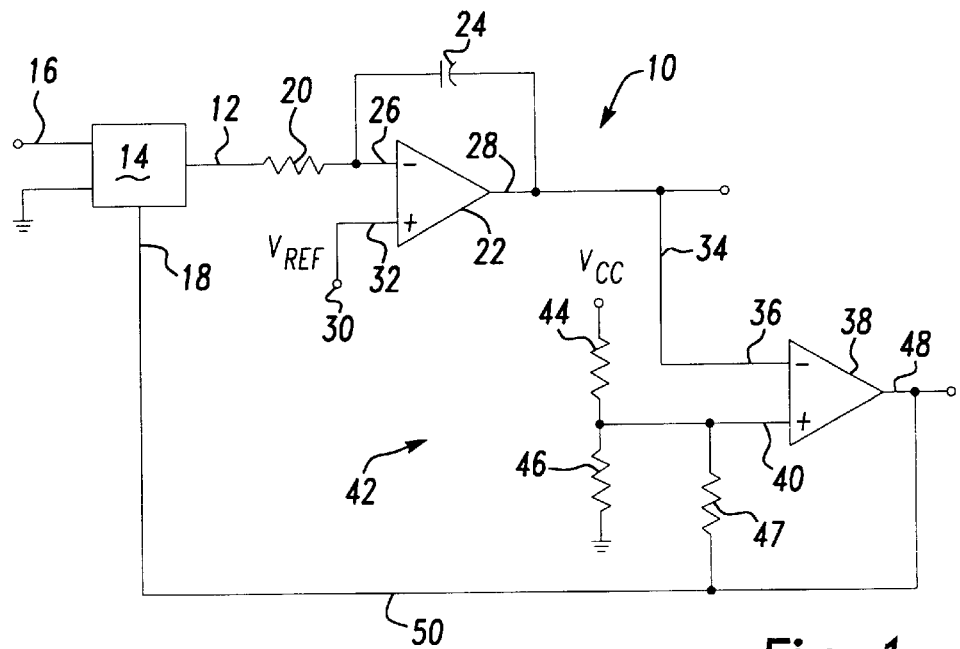
FIG. 1 is an electrical schematic drawing of a prior art ramp generator.

In order to facilitate understanding of the present invention, like elements will be identified by like reference numerals in the various drawings.

FIG. 1 is an electrical schematic drawing of a prior art ramp generator. In FIG. 1, a ramp generator indicated generally at 10 is illustrated as receiving an input signal at an input terminus 12. Input terminus 12 is switched by a switch 14 to be connected to either an input signal from an input signal source 16 or, alternatively, to ground. The connection of input 16 or ground to input terminus 12 is controlled by a feedback signal source control input 18. Of course, switch 14 may be transistors or other devices capable of effecting a switching function. The input signal received at input terminus 12 is applied to an operational amplifier 22 via a resistor 20. A capacitor 24 connected between an inverting input 26 and an output terminus 28 of op amp 22 cooperates with resistor 20 to comprise an integrating circuit.

Figure 1A:
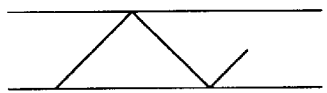
FIGS. 1a and 1b are waveforms associated with the ramp generator shown in FIG. 1.

When a user-selectable set-point signal is applied to a set-point terminal 30 and, thence, applied a non-inverting input 32 of op amp 22, the output of comparator 22 at output terminal 28 is a signal such as the signal illustrated in FIG. 1a. The set-point input signal applied to non-inverting input 32 may be termed $V_{REF}$. The output signal at output terminal 28 of op amp 22 is generated in response to comparison between the signals appearing at inverting input 26 and non-inverting input 32. The operation of the integrator comprised of capacitor 24 and resistor 20 causes a ramp characteristic in the signal at output terminal 28 which climbs and falls at a rate determined by $V_{REF}$ between an upper voltage threshold and a lower voltage threshold, as illustrated in FIG. 1a.

Figure 1B:
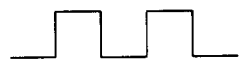

The output signal at output terminal 28 of op amp 22 is also applied via line 34 to an inverting input 36 of a comparator 38. Non-inverting input 40 receives a second reference voltage input from a voltage divider 42 comprised of resistors 44, 46 and 47. Resistor 47 provides hysteresis for comparator 38, providing a higher voltage threshold at terminal 40 when the signal at 48 is high, and providing a lower voltage at terminal 40 when the signal at output 48 is low. This determines the upper and lower $V_{THRESHOLD}$ limits shown in FIG. 1a. The output signal at output terminal 48 of comparator 38 is a square wave signal such as the signal illustrated in FIG. 1b. The square wave output signal at output terminal 48 is fed back via a feedback line 50 to feedback signal source terminal 18. The feedback signal 18 is used to toggle switch 14 to common, and the output signal of op amp 22 at output terminal 28 will continue to repeat the pattern illustrated in FIG. 1a since the input signal received at input terminus 12 is comprised of a square wave signal.

Figure 2:
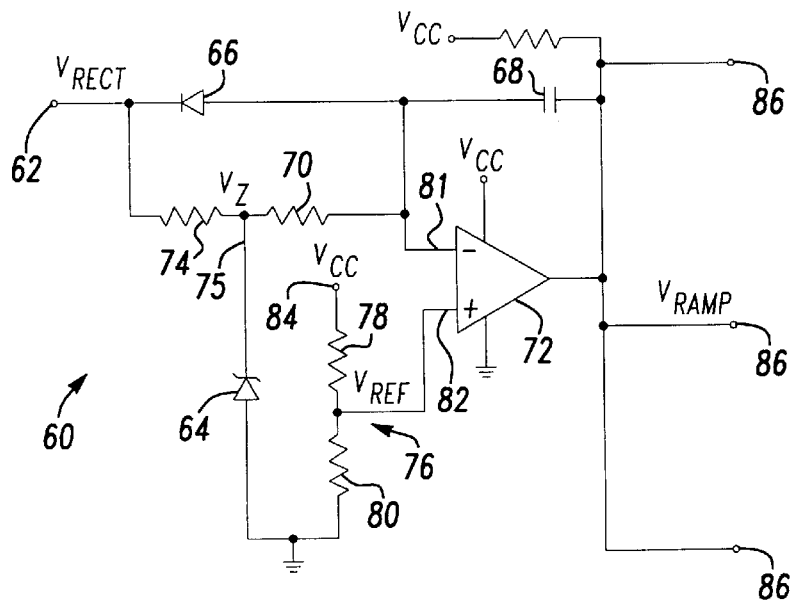
FIG. 2 is an electrical schematic diagram of the preferred embodiment of the ramp generator of the present invention.

FIG. 2 is an electrical schematic diagram of the preferred embodiment of the ramp generator of the present invention. FIG. 3 is a diagram of selected waveforms associated with the present invention.

In FIG. 2, a ramp generator indicated generally at 60 includes an input terminus 62 at which a DC input signal $V_{RECT}$ is applied in order to clamp the ramp upper voltage to a predetermined upper level. Thus, the input signal received at input terminus 62 may be in the form of a full-wave rectified signal, such as the signal schematically represented in FIG. 3a.

A discharge diode 66 has its cathode connected to terminal 62, as does one end of a resistor 74, the other end of which is connected to a node 75. A resistor 70 connects node 75 to the anode of discharge diode 66. A cathode of a zener diode 64 is connected to node 75, its anode being grounded. A capacitor 68 connects an output 86 of an operational amplifier (op amp) 72 to the anode of discharge diode 66, which is connected to an inverting input 81 of op amp 72.

Capacitor 68 and resistor 70 cooperate to perform an integrating function with respect to the output 86 of op amp 72. The resistor 74 limits current flow through zener diode 64. A voltage divider indicated generally at 76 (signal $V_{REF}$) is comprised of resistors 78 and 80 and biases a non-inverting input 82 (signal $V_{REF}$) of op amp 72 in response to a predetermined signal $V_{CC}$ received at signal input 84. An input signal $V_{RECT}$ (a full-wave rectified AC signal such as is illustrated in FIG. 3a) is applied at input terminal 62. The voltage signal tries to pass through resistor 74 but is clamped to approximately 2.5V by the zener diode 64. The resulting voltage $V_Z$ at node 75 (see FIG. 3a) has a fairly constant top and is approximately double the 1.2V of $V_{REF}$ present at input 82 (see FIG. 3a); it therefore causes a relatively constant current to flow into the integrator formed by resistor 70, capacitor 68 and comparator input 81. Op amp 72 generates an output signal $V_{RAMP}$ at output terminals 86 (see FIG. 3b). When $V_{REF}$ becomes less than $V_{REF}$ (1.2V), the discharge diode 66 will pull the non-inverting input 81 of op amp 72 lower than input 82 and the output signal $V_{RAMP}$ will rise quickly to a maximum level $V_{MAX}$ (FIG. 3b) and remain at that maximum level until $V_{RECT}$ is greater than $V_{REF}$. When $V_{RECT}$ and $V_Z$ become greater than $V_{REF}$, the integrating circuit (capacitor 68 and resistor 70) allow $V_{RAMP}$ to decay to a minimum point $V_{MIN}$ where the output signal $V_{RAMP}$ remains until once again input signal $V_Z$ is less than the predetermined signal $V_{REF}$.

Figure 4:
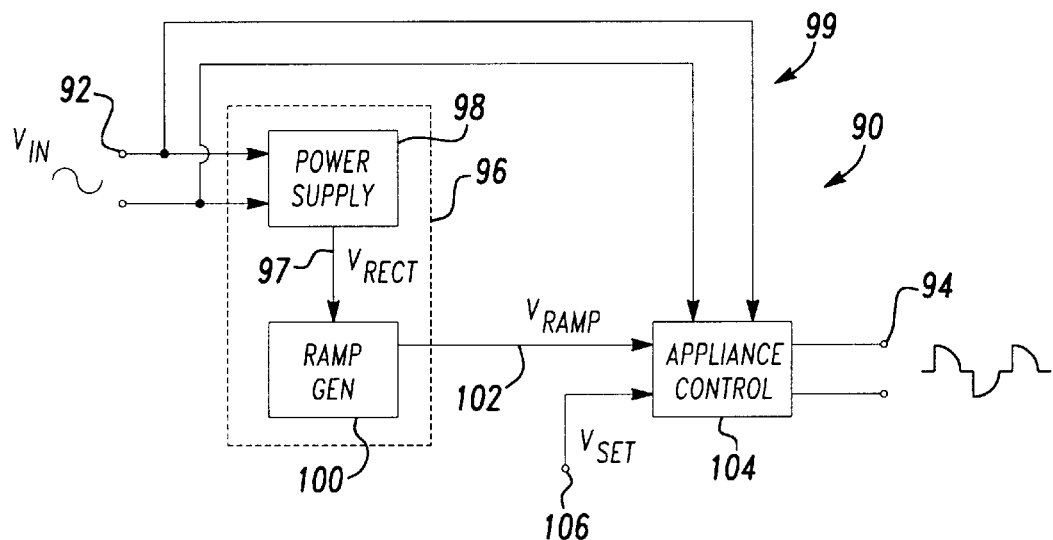
FIG. 4 is a schematic block diagram of an appliance control apparatus according to the present invention.

FIG. 4 is a schematic block diagram of an appliance control apparatus according indicated generally at 90 to the present invention. The appliance control apparatus 90 receives an alternating input signal or input AC power ($V_{IN}$) at input terminus 92. Appliance control apparatus 90 has a connection terminus 94 to which an appliance (not shown) may be connected, as by plugging into a receptacle or other means known in the art, to receive a modified signal or modified AC power waveform based on the alternating signal presented at input terminus 92. Appliance control apparatus 90 controls connection of input terminus 92 with connection terminus 94.

Appliance control apparatus 90 includes a reference signal generating unit indicated by the dashed enclosure at 96, and which includes a power supply 98 and a ramp generator 100. Power supply unit 98 receives the alternating input signal $V_{IN}$ applied at input terminus 92 and generates a rectified AC signal $V_{RECT}$ on a line 97 to ramp generator 100. Ramp generator 100 generates a periodic ramp waveform $V_{RAMP}$ on a line 102 to an appliance control unit 104. Appliance control unit 104 also receives a set-point input signal $V_{SET}$ from a set-point signal terminus 106. The input AC voltage $V_{IN}$ is supplied to appliance control unit 104 via lines 99. Appliance control unit 104 compares $V_{RAMP}$ (received via line 102) with set-point signal $V_{SET}$ (received via set-point signal terminus 106) and controls the amount of AC voltage applied to connection terminus 94 by changing the point at which the AC waveform starts conducting at each half cycle. This is also called phase-firing.

Figure 5:
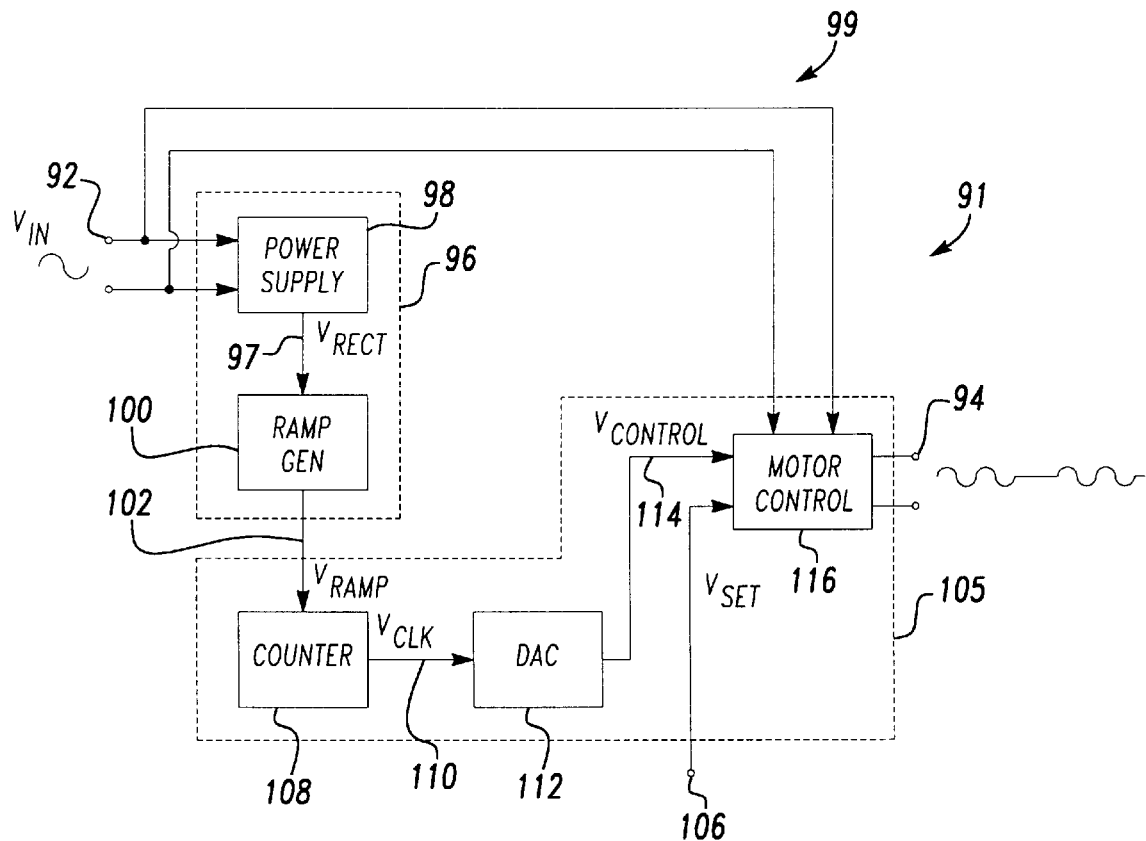
FIG. 5 is a schematic block diagram of an embodiment of the present invention configured for controlling an electrical motor.

FIG. 5 is a schematic block diagram of an embodiment of the present invention configured for controlling an electrical motor. A motor control apparatus indicated generally at 91 receives an alternating input signal at an input terminus 92. The alternating input signal is conveyed from input terminus 92 via lines 99 to an appliance control unit 105, indicated by a dashed enclosure. The input signal received at input terminus 92 is also applied to a reference signal generating unit indicated by dashed enclosure 96, which unit is comprised of a power supply unit 98 and a ramp generator 100. Power supply unit 98 provides an input rectified AC signal $V_{RECT}$ via a line 97 to ramp generator 100. Ramp generator unit 100 generates a signal $V_{RAMP}$ and delivers signal $V_{RAMP}$ via line 102 to appliance control unit 105.

Appliance control unit 105 receives AC voltage from input terminus 92 via lines 99 and determines the number of AC voltage cycles (and the periodic relationship) to apply to connection terminus 94, dependent upon the $V_{RAMP}$ signal received at line 102 and a user-set-point signal $V_{SET}$ received via set-point signal terminus 106.

Appliance control unit 105 is configured differently for motor control apparatus 91 than appliance control unit 104 is configured for appliance control apparatus 90 (FIG. 4). Appliance control unit 105 is comprised of a counter 108, a digital-to-analog converting unit (DAC) 112, and a motor control unit 116. Counter 108 receives signal $V_{RAMP}$ on line 102 and generates a clock signal $V_{CLK}$ on a line 110. DAC 112 receives clock signal $V_{CLK}$ on line 110 and generates a control signal $V_{CONTROL}$ on line 114. Motor control unit 116 receives control signal $V_{CONTROL}$ from line 114 and a user-set-point signal $V_{SET}$ from set-point signal terminus 106. When $V_{CONTROL}$ and $V_{SET}$ have a predetermined relationship, motor control unit 116 effects connection of input terminus 92, via lines 99, with connection terminus 94 for a predetermined number of AC voltage cycles.

By way of example, if a 12.6 volt DC power supply unit 98 is employed, the upper limit $V_{MAX}$ of reference signal $V_{RAMP}$ (FIG. 3b) may be clamped at 11.5 volts DC, and the lower limit $V_{MIN}$ of reference signal $V_{RAMP}$ may be clamped at 0.7 volts DC. Such a range of voltage between $V_{MAX}$ and $V_{MIN}$ is desirable when, for example, a 0–10 volt DC electronically controlled fluorescent ballast and an incandescent light are each to be controlled by control apparatus 90. An electronic ballast having an input impedance may load the 0–10V DC set-point signal $V_{SET}$ so that it falls within the range 0.6–10 volts DC. Since reference signal $V_{RAMP}$ bottoms out at $V_{MIN}$ equal to 0.7 volts DC, the incandescent light can be turned completely off, and the fluorescent ballast and its associated fluorescent lamp can be set to minimum.

Figure 6:
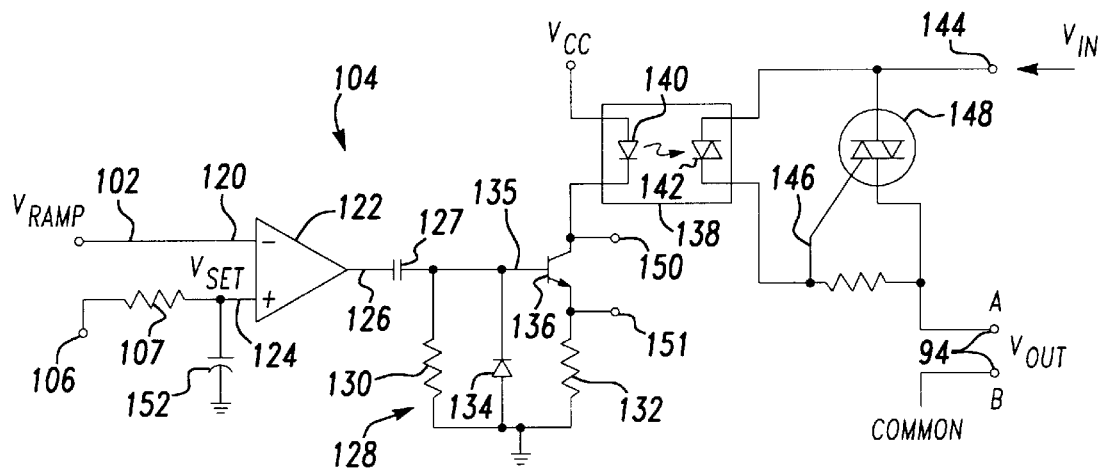
FIG. 6 is an electrical schematic diagram of an embodiment of the appliance control apparatus appropriate for controlling a lighting apparatus according to the present invention.

FIG. 6 is an electrical schematic diagram of the preferred embodiment of an appliance control apparatus, indicated generally at 104, appropriate for controlling a lighting apparatus according to the present invention. An input signal $V_{RAMP}$ appears on line 102 leading to an inverting input 120 of a comparator 122. A set-point input signal is received at set-point signal terminus 106 and is applied through a resistor 107 to non-inverting input 124 of comparator 122. Output terminal 126 of comparator 122 is coupled with a differentiator circuit indicated generally at 128. Differentiator circuit 128 is comprised of resistor 130, diode 134 and capacitor 127. The capacitor 127 connects comparator output 126 to a node 135, which in turn is connected in parallel by resistor 130 and diode 134 to ground. Thus, when the user-set-point signal $V_{SET}$ exceeds $V_{RAMP}$ (see FIG. 3b), the output signal at output terminal 126 of comparator 122 pulses high. Differentiator circuit 128, which may also be described as a one-shot circuit, gates switching transistor 136 when the output signal at output terminal 126 pulses high and maintains switching transistor 136 in an on condition for approximately 1 millisecond (FIGS. 3b and 3d). LED (light emitting diode) 140 in opto-isolator 138 is actuated through switching transistor 136 when switching transistor 136 is gated and LED 140 emits a light output to activate light sensitive element 142. In such manner, input signal $V_{IN}$, applied at pin 144, is applied to triggering line 146 of triac 148 to trigger triac 148 to enable $V_{IN}$ to be applied to pole A of connection terminus 94. Pole B of connection terminus 94 is coupled with the common side of circuit configured for actuation of the appliance (not shown). Once the triac 148 has been triggered, the triac signal on line 146 need not be held positive. The triac 148 will continue to conduct AC current until $V_{IN}$ crosses 0 volts, whereupon triac 148 will shut off until another trigger pulse is received on line 146.

Establishing set-point signal $V_{SET}$ at a higher or lower magnitude will enable connection of input signal $V_{IN}$ to connection terminus 94 during a greater or lesser portion of each half-cycle of input signal $V_{IN}$ and, therefore, provide enabling power to the controlled appliance (not shown) for a greater or lesser portion of the respective half-cycles of input signal $V_{IN}$. In such manner, a dimming or brightening of a lighting fixture, or greater or lesser heating by a radiant heater, may be effected.

Jumper points 150, 151 are provided for bypassing switching transistor 136 by a jumper wire, a switch, or other shorting device in order that a constant-on mode may be achieved for the appliance controlled by appliance control unit 104.

Capacitor 152 may be included in the set-point signal input circuit coupled with non-inverting input 124 of comparator 122 in order to filter AC components from the set-point signal. Such a precaution may be advisable, for example, when the appliance to be controlled is a fluorescent lighting unit.

Figure 7:
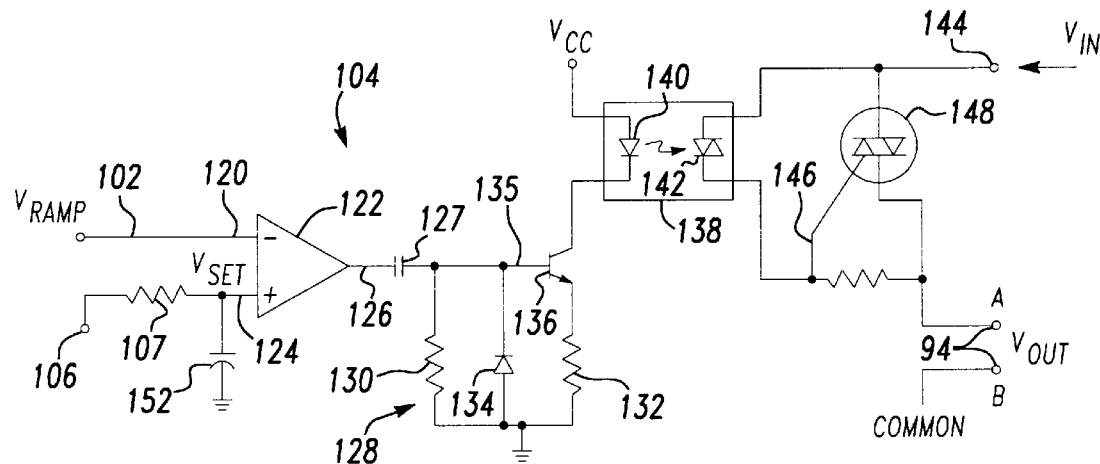
FIG. 7 is an electrical schematic diagram of a preferred embodiment of the appliance control apparatus appropriate for controlling a radiant heater according to the present invention.

FIG. 7 is an electrical schematic diagram of the preferred embodiment of the appliance control apparatus appropriate for controlling a radiant heater according to the present invention. This unit is substantially the same as the appliance control unit illustrated in FIG. 6 for control of a lighting unit, with the exception that jumper points 150, 151 and capacitor 152 are not included in the appliance control unit illustrated in FIG. 7. Accordingly, in order to avoid prolixity, a further detailed description of the appliance control unit illustrated in FIG. 7 will not be undertaken.

FIGS. 8a–8f are timing diagrams of various waveforms associated with the motor control embodiment of the present invention. The illustrated waveforms $V_{RAMP}$, $V_{CLK}$, $V_{CONTROL}$, $V_{SET}$ and $V_{OUT}$ occur at various points in the circuit shown in FIG. 9.

Figure 9:
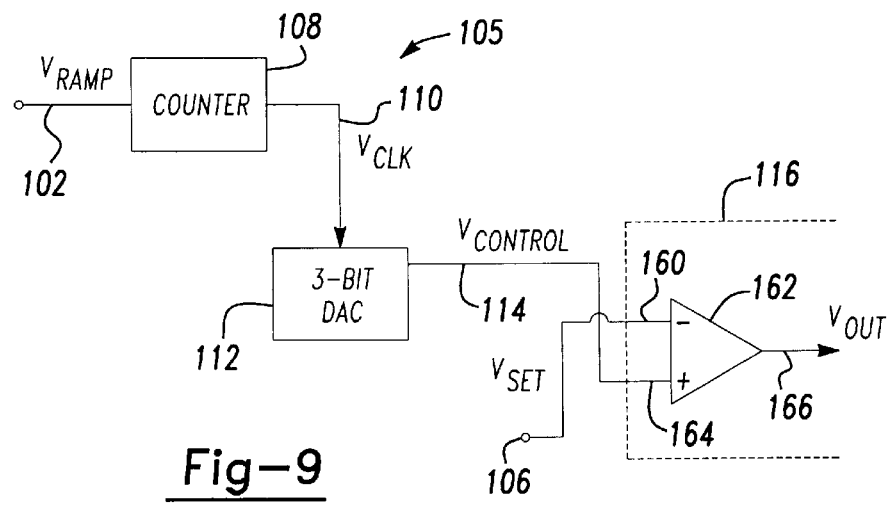
FIG. 9 is a schematic block diagram of the motor control embodiment of the present invention.

FIG. 9 is a schematic block diagram of the motor control embodiment of the present invention.

In FIG. 9, an appliance control unit indicated generally at 105 receives a ramped waveform reference signal $V_{RAMP}$ on a line 102. A representation of reference signal $V_{RAMP}$ in this motor control context is illustrated at FIG. 8a. A counter 108 generates a clock signal $V_{CLK}$ (FIG. 8b) on a line 110. Clock signal $V_{CLK}$ is applied to a three bit digital-to-analog converter (DAC) 112 via line 110. DAC 112 generates a control signal $V_{CONTROL}$ (FIG. 8c) on a line 114 that applies control signal $V_{CONTROL}$ to motor control unit 116. In particular, as illustrated in FIG. 9, the input to motor control unit 116 via line 114 is applied to noninverting input 164 of a comparator 162. Set-point signal terminus 106 receives set-point signal $V_{SET}$ which is applied to inverting input 160 of comparator 162. A representative of set-point signal $V_{SET}$ is presented at FIG. 8d.

Comparator 162 compares control signal $V_{CONTROL}$ received at its noninverting input 164 with set-point signal $V_{SET}$ received at its inverting input 160 and, in response to that comparison, generates an output signal $V_{OUT}$ (FIG. 8e) at output terminal 166. Output signal $V_{OUT}$ is employed with further components of motor control unit 116, as will be described in greater detail hereinafter in connection with FIG. 10.

DAC 112 generates control signal $V_{CONTROL}$ as an asymmetrically periodized reference signal. Referring to FIG. 8c, stairstep control signal $V_{CONTROL}$ in a first period steps up four levels to a maximum value $V_{M1}$, then goes back to a low value, such as 0.1V, for a time. A nonzero voltage is chosen to actuate fan shutoff. During a second period, control signal $V_{CONTROL}$ steps only three steps to a maximum value $V_{M2}$, then goes to a low value for a time. The pattern: low value interval, four steps up to value $V_{M1}$, low value interval, step up three steps to maximum value $V_{M2}$, and low value interval, is repeated so that control signal $V_{CONTROL}$ is an asymmetrically periodized reference signal applied to line 114. Noninverting input 164 of comparator 162 in motor control unit 116 receives control signal $V_{CONTROL}$ from line 114.

Figure 10:
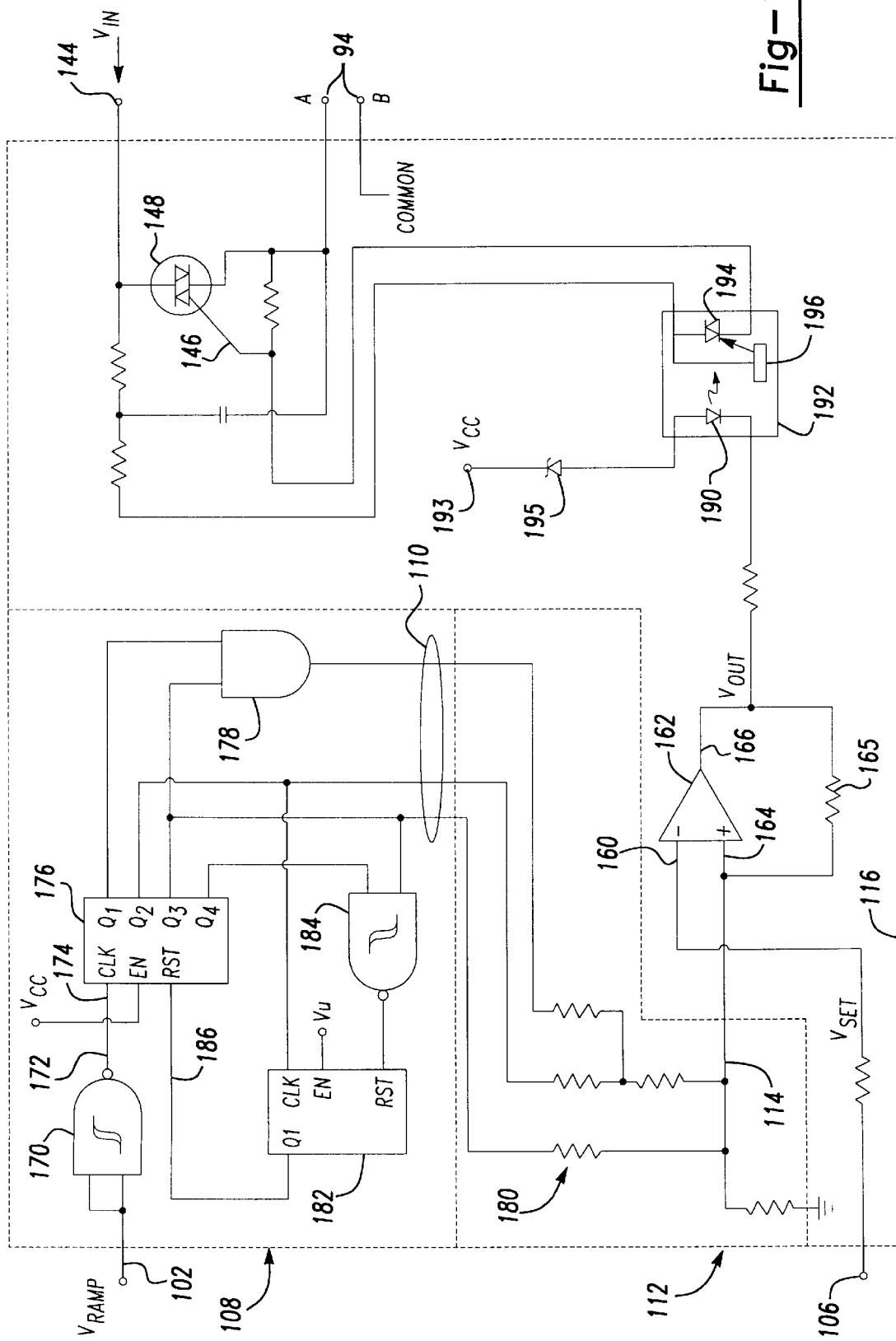
FIG. 10 is an electrical schematic diagram of the preferred embodiment of the motor control embodiment of the present invention.

FIG. 10 is an electrical schematic diagram of the preferred embodiment of the motor control embodiment of the present invention. In FIG. 10, a reference signal $V_{RAMP}$ is received at line 102 by a counter indicated by a dashed enclosure at 108. Counter 108 is comprised of a Schmitt trigger NAND gate 170 connected to act as an inverter and wave shaper to create, for example, a twenty nanosecond rise and fall time on a line 172 to the CLK input 174 of an up-counter 176.

The $Q_1$, $Q_2$, $Q_3$ outputs of up-counter 176 are connected to a resistor network indicated at 180 which comprises DAC 112. Outputs $Q_1$ and $Q_3$ of up-counter 176 are also connected with resistor network 180 via AND gate 178. Outputs $Q_3$ and $Q_4$ are further connected to a reset pin of a second counter 182 via a Schmitt trigger NAND gate 184, and $Q_1$ of this counter 182 is connected to reset pin 186 of up-counter 176. This connection and interaction of counters 176, 182 generates counter outputs on line(s) 110 from counter 108 to DAC 112, summing to $V_{CONTROL}$ (FIG. 8c) at node 114. The five resistors composing resistor network 180 is configured appropriately to create an analog stairstep with eight possible steps (i.e., a three bit DAC) connected to the non-inverting input 164 of comparator 162.

Up-counter 176 will count in binary in response to receiving $V_{CLK}$ pulses on input 174, energizing selected ones of the outputs $Q_1$–$Q_4$ as it does so. The supply voltage $V_{CC}$ as appearing on one or more of $Q_1$–$Q_3$ creates the voltage levels on lines 110 which connects to resistor divider network 180 and yields the stairstep signal $V_{CONTROL}$ as shown in FIG. 8c; therefore as more of the $V_{CLK}$ lines (110) are connected to $V_{CC}$, the voltage at node 114 is raised.

A combination of outputs from $Q_2$, $Q_3$ and $Q_4$ of counter 176 is used to reset counter 176 in an asymmetrically periodic fashion. Reaching binary count 1000 (on the eighth clock pulse) will cause the stairstep signal $V_{CONTROL}$ to fall back to a base level, after stepping up four levels through seven clock pulses (Note: Three clock pulses result in no level change on $V_{CONTROL}$.) From counts 0000 through 1011, the output of NAND gate 184 is high causing counter 182 to be in reset (which causes $Q_1$ (line 186) to be low). When count 1100 is reached, both $Q_3$ and $Q_4$ will be high, causing the output of Schmitt trigger 184 to go low and take counter 182 out of reset. Two clocks later, 1110 will be reached, clocking counter 182 and resetting counter 176 to zero; the second stairstep cycle is therefore of shorter duration and of less amplitude than the first, stepping only three levels through five clock pulses. The overall waveform $V_{CONTROL}$ then repeats. The different levels of $V_{CONTROL}$ have a sufficiently long duration that each of them will correspond to either a fall line cycle or a half line cycle. Selection of a full cycle reduces motor heating caused by DC offset at lower speeds. Half cycles are permissible at higher speeds and allow more speed selection.

Resistor 165 is connected between output terminal 166 and non-inverting input 164 of comparator 162 to create hysteresis so that the motor (not shown) will shut off when set-point voltage $V_{SET}$ drops below a predetermined level, such as 0.3 volt.

When output voltage $V_{OUT}$ at output terminal 166 goes high, current does not flow through light emitting diode (LED) 190 of zero-cross opto-isolator 192. When output voltage $V_{OUT}$ goes low (FIG. 8e), current flows from supply voltage terminus 193 through zener diode 195 and LED 190, thereby generating an optical output from LED 190 which triggers optically sensitive element 194. Whether optically sensitive triac 194 passes current therethrough is dependent upon zero-cross element 196. Input signal $V_{IN}$ is applied at pin 144 and to triac 148, as well as to optically sensitive triac 194 in zero-cross opto-isolator 192. When optically sensitive element 194 is triggered to pass current therethrough and AC input signal $V_{IN}$ is crossing zero volts, input signal $V_{IN}$ is passed to triggering line 146 to trigger triac 148. Triggering triac 148 applies input signal $V_{IN}$ to pole A of connection terminus 94. Pole B of connection terminus 94 is connected to the common side of the circuit configured for actuation of the motor (not shown). The signal applied at connection terminus 94 is illustrated in FIG. 8f.

Moving set-point signal $V_{SET}$ to a greater or lesser magnitude involves set-point $V_{SET}$ being greater than control signal $V_{CONTROL}$ a greater or lesser amount of time. The duration of time during which set-point signal $V_{SET}$ exceeds control signal $V_{CONTROL}$ is determined by the level at which set-point signal $V_{SET}$ intersects control signal $V_{CONTROL}$ (FIG. 8c). When $V_{SET}$ goes to 0 volts, $V_{OUT}$ remains high, output triac 148 is not triggered, and there is no voltage applied to pole A of terminus 94. At high speed, that is at a high magnitude of set-point signal $V_{SET}$, only the step of control signal $V_{CONTROL}$ between $V_{M2}$ and $V_{M1}$ will be involved with set-point signal $V_{SET}$. Such a relationship between set-point signal $V_{SET}$ and control signal $V_{CONTROL}$ will provide the longest duration low value of output signal $V_{OUT}$ of the combinations and interactions of set-point signal $V_{SET}$ with control signal $V_{CONTROL}$. Such a long duration of low value for output signal $V_{OUT}$ will result in the longest duration of conduction of current through LED 190 of the combinations possible between set-point signal $V_{SET}$ and control signal $V_{CONTROL}$. The motor is actuated longer, and goes faster. The inventors have found that the asymmetrically periodized character of control signal $V_{CONTROL}$ provides a greater variety of speed selections and reduces noise in controlling a motor.

It is to be understood that, while the detailed drawings and specific examples given describe preferred embodiments of the invention, they are for the purpose of illustration, that the apparatus of the invention is not limited to the precise details and conditions disclosed and that various changes may be made therein without departing from the spirit of the invention which is defined in the following claims.

We claim:

1. Apparatus for controlling an electrical appliance coupled with an output terminus of the apparatus and being configured to operate in response to an alternating input signal, the apparatus comprising:

a reference signal generator for receiving said input signal and generating a reference signal in response to said input signal; and a controller for controlling connection of said input signal to said output terminus in response to said reference signal and to a user-defined set-point signal, said controller being coupled with said reference signal generator and with a set-point terminal for receiving said set-point signal, said controller interrupting connection of said input signal with said output terminus in response to a predetermined relationship between said reference signal and said set-point signal, said controller including:

a counter for generating a clock signal, said counter being coupled with said reference signal and generator and receiving said reference signal, said counter generating said clock signal in response to said reference signal;

a digital-to-analog convertor for converting digital signals to analog signals, said digital-to-analog convertor being coupled with said counter to receive said clock signal, said digital-to-analog convertor generating an asymmetrically periodized reference signal in response to said clock signal; and a comparator for comparing said asymmetrically periodized reference signal and a user-defined set-point signal, said comparator being coupled with said digital-to-analog convertor and with a set-point terminal, said comparator receiving said asymmetrically periodized reference signal, said set-point terminal receiving said set-point signal and generating a control signal for interrupting said connection when said asymmetrically periodized reference signal and said set-point signal are in a predetermined relationship.

2. The apparatus of claim 1, wherein said controller further comprises an isolator for electrically isolating said comparator from said output terminus.

3. The apparatus of claim 2, wherein said isolator is an optically coupled isolator coupled with said comparator and with said output terminus, said optically coupled isolator being responsive to said output signal from said comparator to effect said interrupting of said connection of said input signal with said output terminus.

4. The apparatus of claim 1, wherein said controller further comprises an isolator for isolating said output terminus from said comparator, said isolator being coupled between said comparator and said output terminus, said isolator responding to said control signal to effect said connection interruption.

5. Apparatus for controlling an electrical appliance, said appliance being coupled with an apparatus output terminus and being configured to operate in response to an input signal, the apparatus comprising:

ramp signal generating means for receiving said input signal and generating a ramp reference signal in response to said input signal;

comparing means for comparing said ramp reference signal with a user-defined set-point signal, said comparing means being coupled with said ramp signal generator and with a set-point terminal, said set-point terminal receiving said set-point signal, said comparing means generating a control signal when said ramp reference signal and said set-point signal are in a predetermined relationship;

isolating means for electrically isolating said comparing means from said output terminus, said isolating means responding to said control signal to couple said input signal with said output terminus; and a counter means for counting time intervals and a digital-to-analog converter means for converting digital signals to analog signals, said counter means and said digital-to-analog converting means being coupled together between said ramp signal generating means and said comparing means, said counter means being coupled with said ramp signal generating means and receiving said ramp reference signal from said ramp signal generating means, said digital-to-analog converting means being coupled with said counter means and receiving a clock signal from said counter means, said digital-to-analog converting means generating a stepped asymmetrically periodized reference signal in response to said clock signal, said comparing means receiving said asymmetrically periodized reference signal and comparing said asymmetrically periodized reference signal with said set-point signal to generate said control signal when said asymmetrically periodized reference signal and said set-point signal are in said predetermined relationship.

6. The apparatus of claim 5 wherein said isolating means is an optically coupled isolator.

7. The apparatus of claim 5 wherein said appliance is an electrical motor.

8. Apparatus for modifying input AC power for application to an appliance, comprising:

a ramp generator for generating a periodic ramp waveform, each period of said ramp waveform having a ramp portion linearly varying between a maximum voltage level and a minimum voltage level; and an appliance controller coupled to said ramp generator for receiving said periodic ramp waveform, said appliance controller further coupled to an AC power supply for receiving input AC power and an input for a set-point voltage signal having a user-selectable voltage level, said appliance controller having a modified AC power output adaptable to be coupled to said appliance, said appliance controller generating a modified AC power waveform on said modified AC power output as a function of said ramp waveform and said setting voltage signal, said appliance controller produces a periodic stairstep control signal waveform as a function of said periodic ramp waveform, said controller outputting at least a portion of a periodic power waveform when the level of said stairstep control signal waveform is below the level of said set-point voltage signal, said appliance controller otherwise outputting no waveform on said modified AC power output.

9. The apparatus of claim 8, wherein said appliance controller compares the level of said ramp portion with the level of the set-point voltage signal, said appliance controller blocking said input AC power from being coupled to said AC modified power output until said ramp portion becomes the same as the level of the set-point voltage signal, at which time said input AC power is coupled to said modified AC power output.

10. The apparatus of claim 8, wherein said portion of said periodic power waveform is outputted by said appliance controller until said portion crosses 0 volts.

11. The apparatus of claim 8, wherein said controller generates said stairstep control waveform as a function of numbers of counts of cycles of said periodic ramp waveform.

12. The apparatus of claim 11, wherein the numbers of counts of cycles varies through a plurality of cycles of said stairstep control signal waveform, the variability of the numbers of counts of cycles creating an asymmetrically periodic stairstep control signal waveform.

13. The apparatus of claim 8, wherein said apparatus further comprises a rectifier receiving said input AC power and outputting a rectified AC signal, said ramp generator having an input receiving said rectified AC signal and generating said periodic ramp waveform as a function of said rectified AC signal.

14. The apparatus of claim 13, wherein said periodic ramp waveform has the same period as said rectified AC signal.

15. Apparatus for generating an asymmetrically periodic alternating waveform, comprising:

a sensor having an input for receiving a periodic waveform, said sensor sensing each cycle of said periodic waveform and outputting a pulse in response thereto;

counting circuitry having a clock input coupled to said sensor for receiving said pulse and having a plurality of count outputs, signals appearing on preselected ones of said count outputs as a function of the count of said pulses;

a stairstep signal generator coupled to said count outputs and having a stairstep signal output, said stairstep signal generator generating an asymmetrically periodic stairstep signal which increases from a base level and having a plurality of levels, said stairstep signal changing levels as a function of change of preselected ones of said count output signals, said counting circuitry counting to a first number which causes said stairstep signal to increase to a first one of said plurality of levels before dropping to a base level, said counting circuitry then counting to a second number which causes said stairstep signal to increase from said base level to a second one of said plurality of levels which is different than said first one of said plurality of levels; and a controller having an input coupled to said stairstep signal output and a second input for receiving a user-selectable set-point signal, said controller generating an alternating portion of said asymmetrically periodic alternating waveform when said set-point signal is in a predetermined mathematical relation to the level of said stairstep signal, said controller otherwise generating a constant portion of said asymmetrically alternating waveform.

16. The apparatus of claim 15, wherein said periodic waveform is a ramped waveform.

17. The apparatus of claim 15, wherein said controller receives as an input a symmetrically periodic alternating waveform, said controller generating said asymmetrically periodic alternating waveform as a function of said symmetrically periodic alternating waveform.

18. An apparatus for controlling an appliance operable from a source of alternating current, comprising:

a waveform generator for generating an asymmetrically periodized stairstep signal;

a comparator for comparing said asymmetrically periodized stairstep signal with a user-defined set-point signal and generating a trigger signal when said asymmetrically periodized stairstep signal and said user-defined set-point signal are in a predetermined relationship; and a switching device for receiving said trigger signal and having a port for coupling to said source of alternating current, said switching device supplying a periodically disable alternating current signal to said appliance in periods that vary in accordance with said asymmetrically periodized stairstep signal.

19. The apparatus of claim 18 wherein said waveform generator generates a stairstep waveform having a plurality of discrete amplitudes.

20. The apparatus of claim 18 wherein said waveform generator comprises a counter for generating a clock signal and a digital-to-analog convertor receptive of said clock signal for generating said asymmetrically periodized stairstep signal.

21. The apparatus of claim 20 further comprising a ramp generator coupled to said counter for supplying a variable control signal for controlling the period of said clock signal.

22. The apparatus of claim 18 wherein said appliance is selected from the group consisting of an electrical motor and an electric light.

23. The apparatus of claim 18 wherein said appliance is an alternating current motor.

* * * * *